(12) United States Patent
Fender et al.

(10) Patent No.: US 7,184,906 B2
(45) Date of Patent: Feb. 27, 2007

(54) SYSTEMS AND METHODS FOR PERFORMING MULTI-SOURCE MEASUREMENTS

(75) Inventors: Michael R. Fender, Colorado Springs, CO (US); Warren S. Tustin, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 512 days.

(21) Appl. No.: 10/606,897

(22) Filed: Jun. 26, 2003

(65) Prior Publication Data

US 2004/0267470 A1    Dec. 30, 2004

(51) Int. Cl.
*G01R 13/02* (2006.01)
(52) U.S. Cl. .......................................... 702/67
(58) Field of Classification Search .................. 702/67; 324/379, 309; 345/440, 17, 522; 340/712; 715/763
See application file for complete search history.

(56) References Cited

U.S. PATENT DOCUMENTS

| | | | |
|---|---|---|---|
| 4,821,030 A * | 4/1989 | Batson et al. | 345/173 |
| 5,481,741 A * | 1/1996 | McKaskle et al. | 345/522 |
| 5,821,934 A * | 10/1998 | Kodosky et al. | 715/763 |
| 5,898,307 A * | 4/1999 | Taraki et al. | 324/379 |
| 6,166,544 A * | 12/2000 | Debbins et al. | 324/309 |
| 6,791,545 B2 * | 9/2004 | Miller et al. | 345/440 |

\* cited by examiner

*Primary Examiner*—John Barlow
*Assistant Examiner*—Aditya Bhat

(57) ABSTRACT

Systems and methods for performing multi-measurements are provided. One such method includes: displaying a first icon corresponding to a multi-source measurement, displaying waveforms, visually associating the first icon with at least one of the waveforms responsive to user input, and performing a multi-source measurement related to the waveforms.

19 Claims, 14 Drawing Sheets

SYSTEMS AND METHODS FOR PERFORMING MULTI-SOURCE MEASUREMENTS

BACKGROUND

Modern oscilloscopes are powerful and complex tools for performing various tasks. A common task performed by an oscilloscope is a multi-source measurement, such as, for example, delay, phase difference, setup-time, and hold-time measurements.

In performing tasks, an operator often uses a user interface (UI) of the oscilloscope. Navigating the UI of such an oscilloscope can often be difficult and time consuming. For example, past implementations of the UI have required a user to navigate menus and dialogs to initiate a multi-source measurement. Using menus and dialogs to initiate a multi-source measurement is, unfortunately, a slow and cumbersome process.

SUMMARY

An embodiment of a method for performing a multi-source measurement includes: displaying a first icon corresponding to a multi-source measurement, displaying waveforms, visually associating the first icon with at least one of the waveforms responsive to user input, and performing a multi-source measurement related to the waveforms.

An embodiment of a system for performing a multi-source measurement includes a display and at least one processor. The processor is programmed to: cause a first icon corresponding to a multi-source measurement to be displayed by the display, cause waveforms to be displayed by the display, cause the first icon to be visually associated with at least one of the waveforms responsive to user input, and perform a multi-source measurement related to the waveforms.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. Furthermore, the components in the drawings are not drawn to scale.

DETAILED DESCRIPTION

As will be described in more detail below, systems and methods may allow a user to quickly and easily initiate a multi-source measurement. For example, a user may initiate a multi-source measurement by using a pointing device (e.g., a mouse) to associate one or more icons with a plurality of waveforms for which the multi-source measurement is desired.

Figure 1:
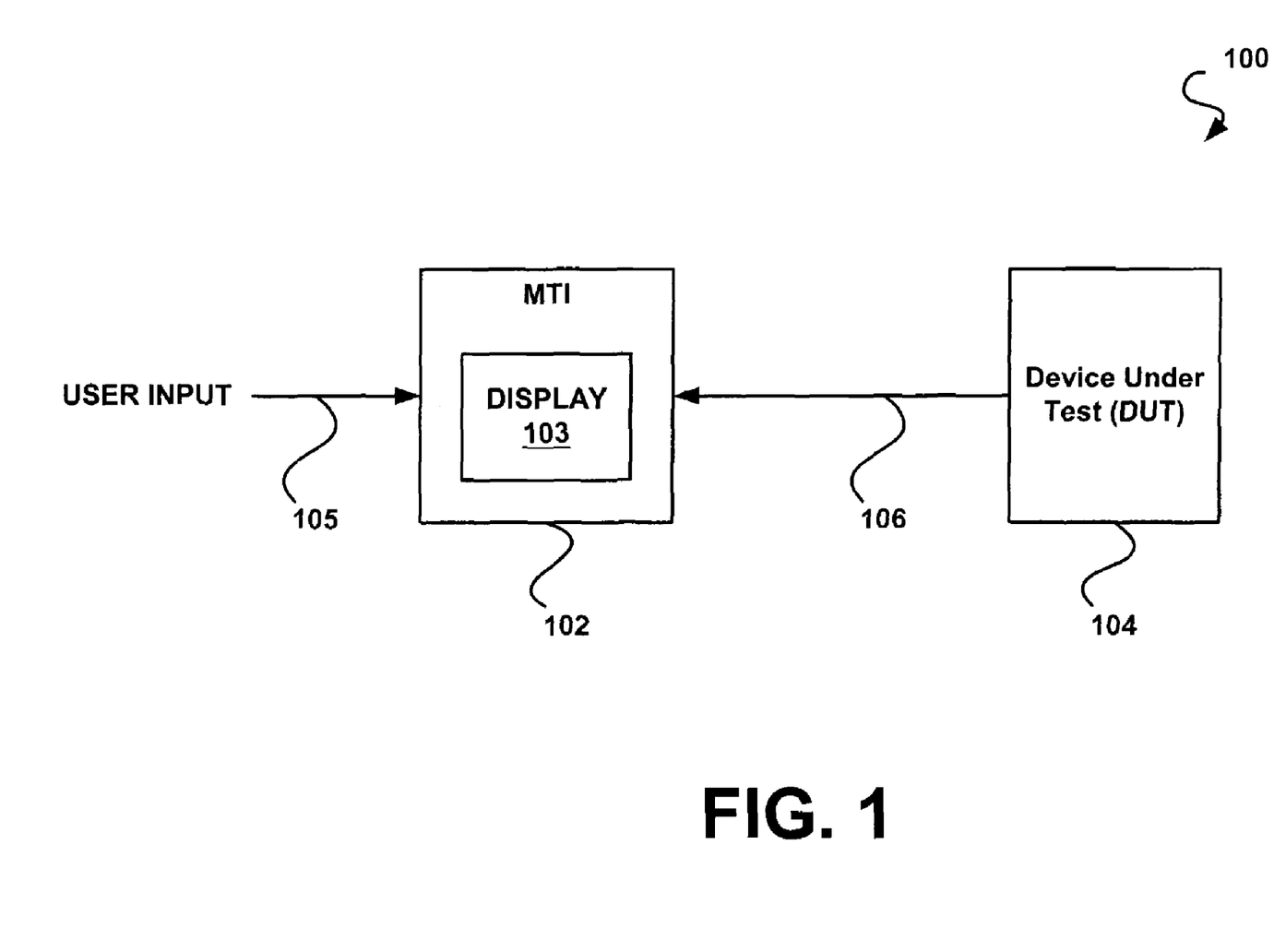
FIG. 1 is a block diagram depicting an embodiment of a measurement system.

FIG. 1 is a block diagram depicting an embodiment of a measurement system 100. The measurement system 100 includes a measurement and testing instrument (MTI) 102 and a device under test (DUT) 104. The MTI 102 is configured to measure characteristics of signals 106 provided by the DUT 104. Note that the signals 106 may be provided via a probing instrument (e.g., a voltage probe) that is used to probe the DUT 104. The MTI 102 may be, for example, an oscilloscope, a spectrum analyzer, a logic analyzer, a vector analyzer, a network analyzer, or a time interval analyzer. The DUT 104 may be any electronic device or circuit that is to be tested.

The MTI 102 includes a display 103 that displays waveforms corresponding to respective signals 106 received from the DUT 104. The display 103 may be any type of display now known or later developed. The display 103 may be, for example, among others, a cathode ray tube (CRT) display, a liquid crystal display (LCD) display, or a plasma display. The MTI 102 receives user input 105 requesting a desired measurement, and provides the user with the desired measurement via the display 103.

Figure 2:
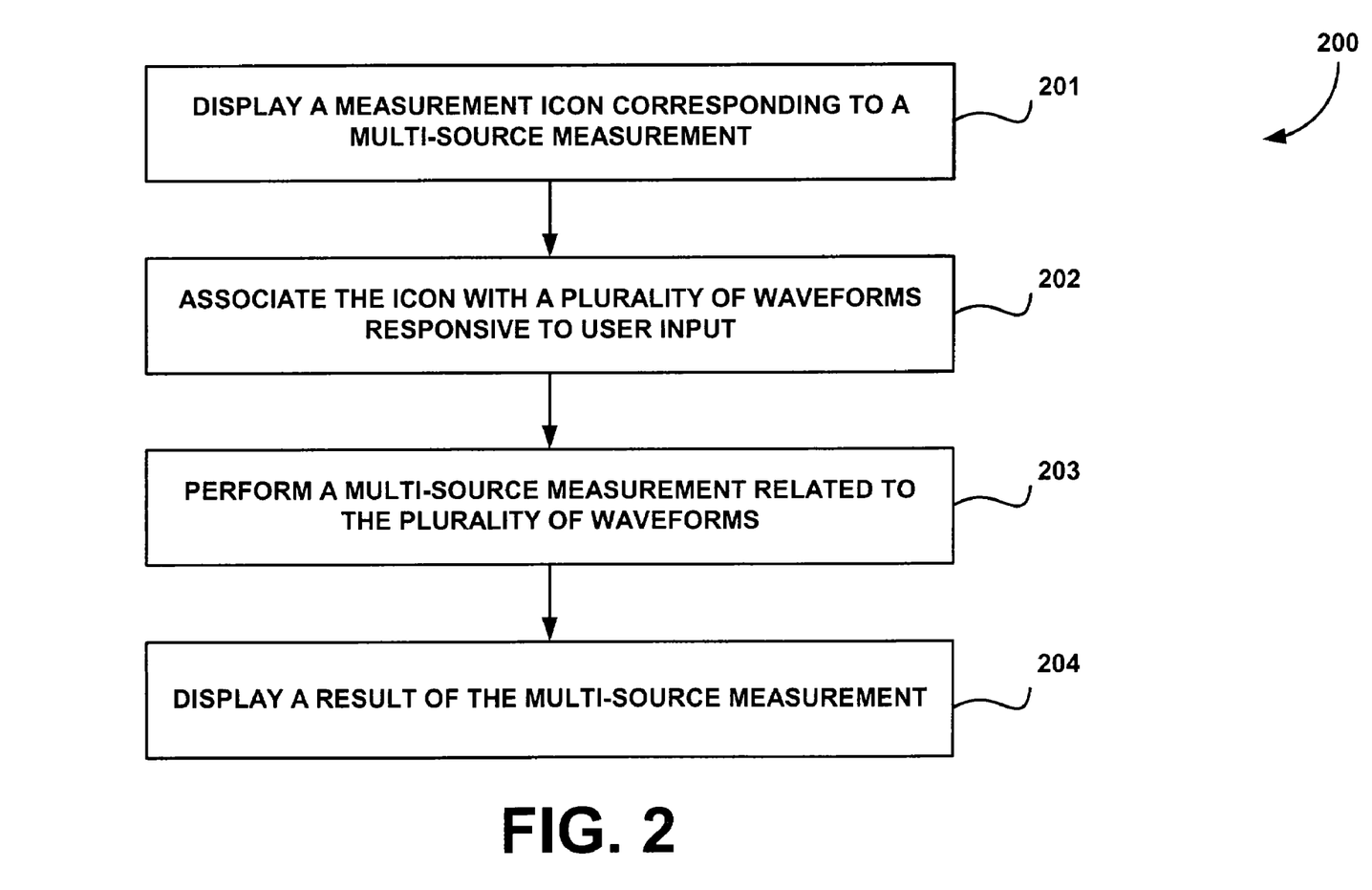
FIG. 2 is a flow chart depicting an embodiment of a multi-source measurement method that may be implemented by the measurement and testing instrument (MTI) shown in FIG. 1.
Figure 6A:
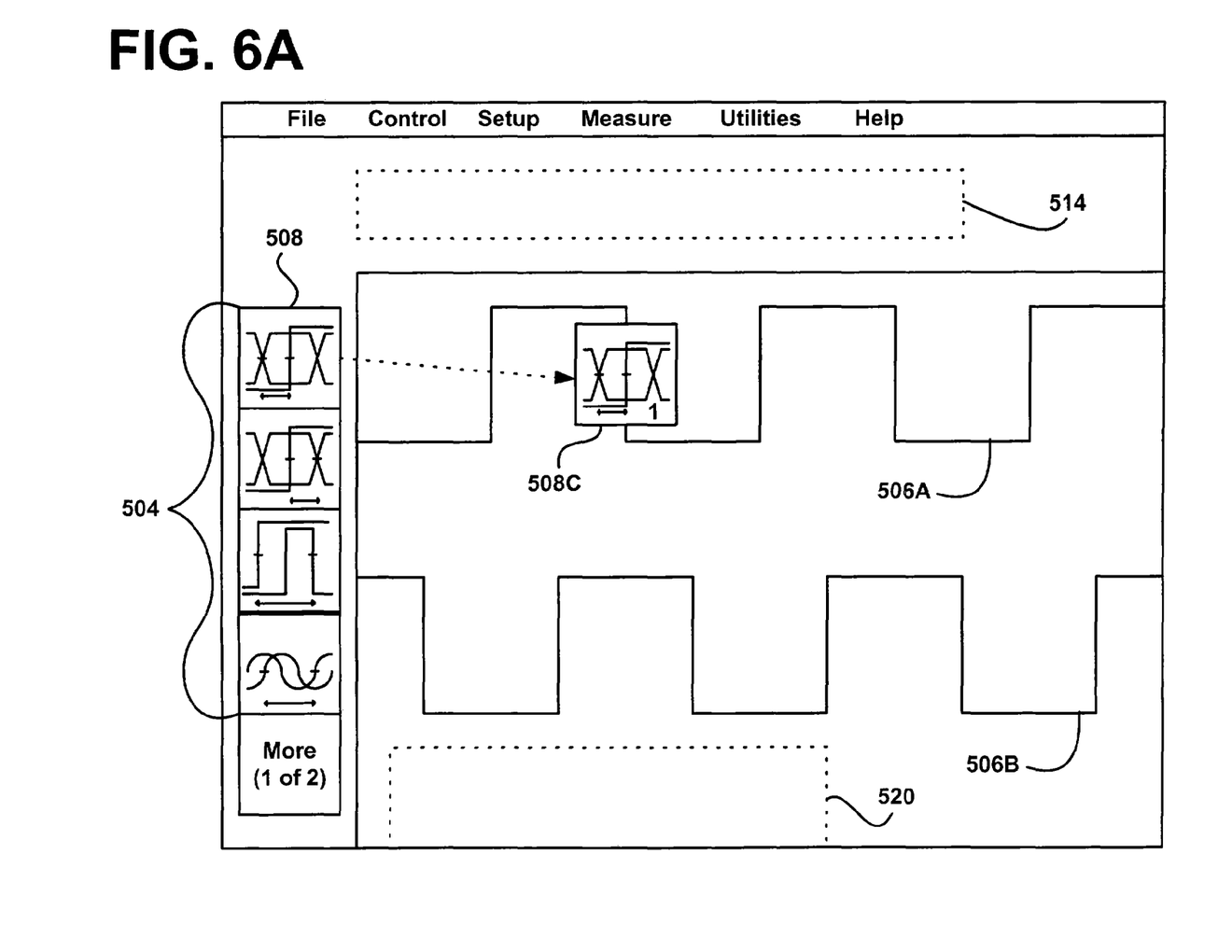
FIGS. 6A and 6B depict another example of a GUI that that may be provided by the MTI shown in FIG. 1.
Figure 6B:
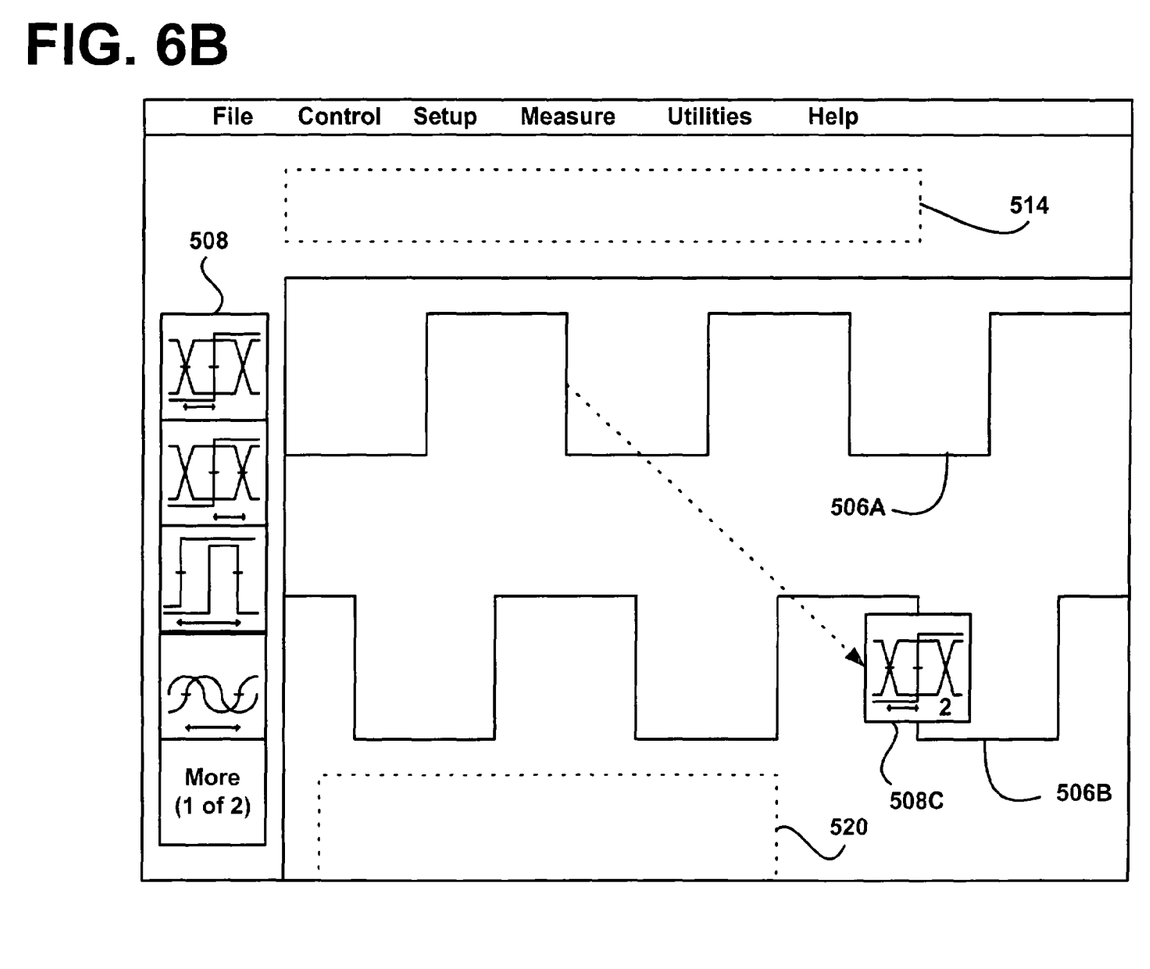

FIG. 2 is a flow chart depicting an embodiment of a multi-source measurement method 200. As indicated in block 201, a measurement icon corresponding to a multi-source measurement is displayed (e.g., via the display 103 (FIG. 1)). The measurement icon preferably includes an image that identifies a corresponding multi-source measurement. Then in block 202, the measurement icon is associated with a plurality of waveforms responsive to user input (e.g., as illustrated in FIGS. 6A and 6B).

The user input may be provided by, for example, a pointing device (e.g., a mouse, a trackball, or a joy-stick). If a mouse is used, then an icon may be dragged by, for example, moving a mouse until a cursor is located over the desired icon, pressing a mouse button to select the icon, and then moving the mouse while keeping the mouse button pressed until the icon arrives at a desired destination.

After a measurement icon has been dragged to and dropped at a plurality of waveforms, a multi-source measurement related to the waveforms is performed, and the result of the measurement is displayed, as suggested in blocks 203 and 204, respectively. Note that in some embodiments, an icon being dragged may have a different appearance from the corresponding icon that was initially selected for dragging.

Figure 3:
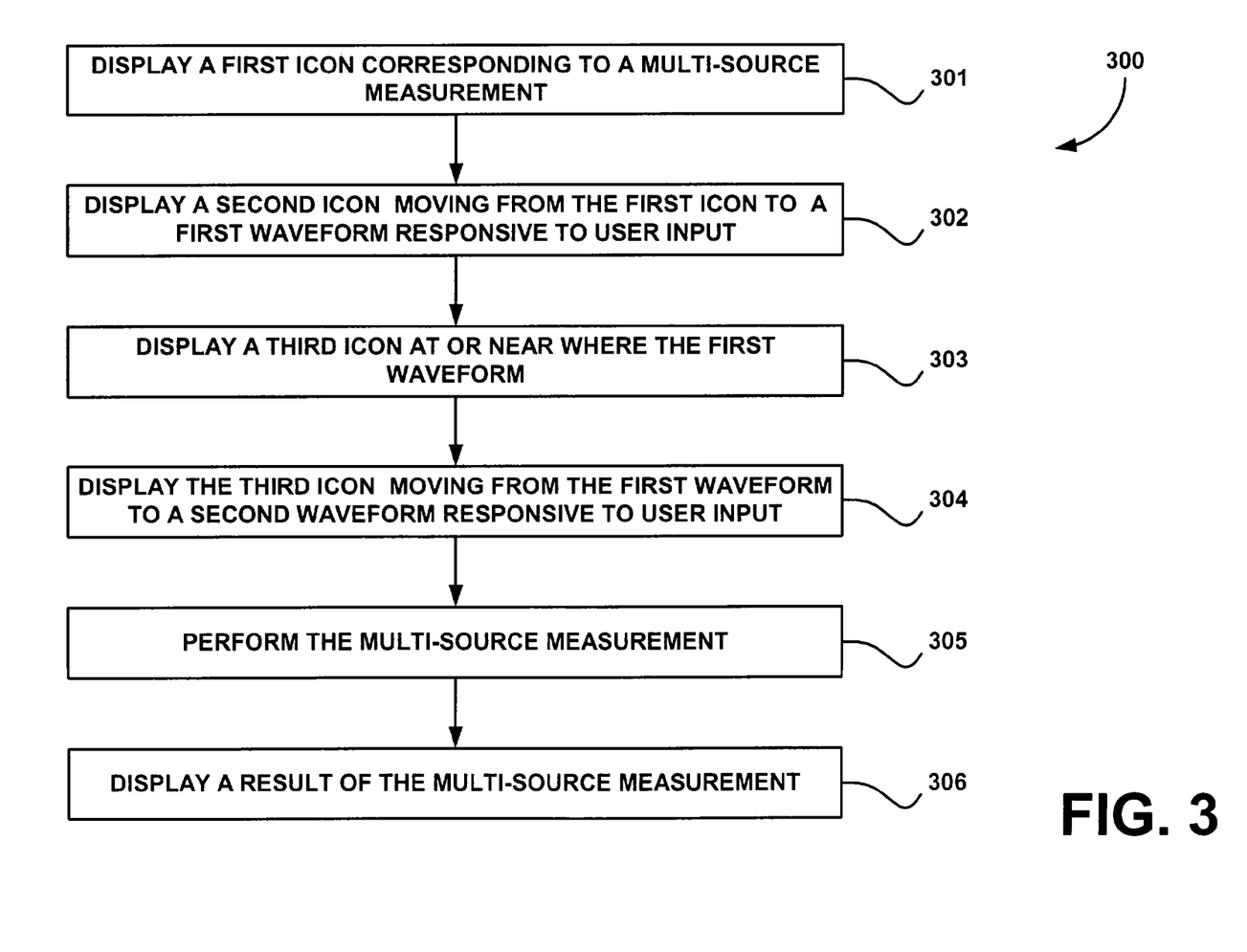
FIG. 3 is a flow chart depicting another embodiment of a multi-source measurement method that may be implemented by the MTI shown in FIG. 1.

FIG. 3 is a flow chart depicting an embodiment of a multi-source measurement method 300. As indicated in block 301, a first icon corresponding to a multi-source measurement is displayed. A second icon is then displayed moving from the first icon to a first waveform responsive to user input, as suggested by block 302. The second icon may be displayed as, for example, a top-displayed icon in a stack of icons.

A third icon is then displayed, at or near the first waveform, as suggested by block 303. The third icon may be, for example, a newly top-displayed icon in a stack of icons. This third icon is preferably configured to suggest to the user that a measurement location on a second waveform is yet to be identified by the user.

The third icon is displayed moving from the first waveform to the second waveform responsive to user input, as suggested by block 304. A multi-source measurement related to both the first and second waveforms is then performed, and a result of the measurement is displayed to a user, as suggested in blocks 305 and 306, respectively.

Figure 4:
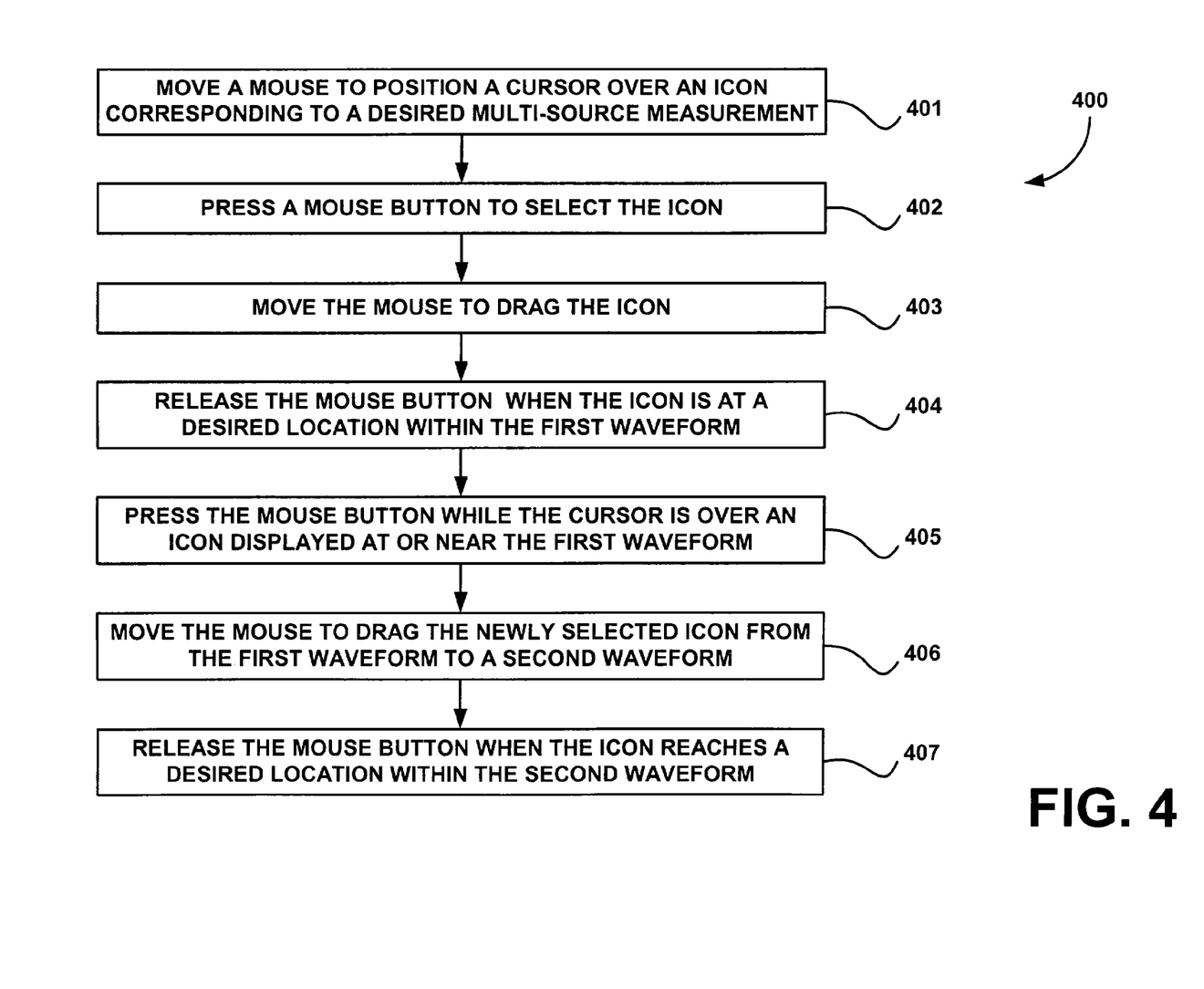
FIG. 4 is a flow chart depicting an embodiment of a method for providing user input to the MTI shown in FIG. 1.

FIG. 4 is a flow chart depicting an embodiment of a method 400 for providing user input. The method 400, which is described as being performed by a mouse, may alternatively be performed by another input device such as, for example, among others, a joy-stick or a track-ball. As indicated in block 401, a mouse is moved to position a cursor over an icon corresponding to a desired multi-source measurement. Then in block 402, a mouse button is pressed to select the icon. The mouse is then moved in order to drag an icon (or stack of icons) corresponding to the multi-source measurement, as suggested by block 403. The icon being dragged is preferably identical to or similar in appearance to the selected icon. For example, the icon being dragged may be a copy of the selected icon, and may be a top-displayed icon in a stack of icons being dragged.

The mouse button is released when the icon being dragged is at a desired measurement location on or near the first waveform, as suggested by block 404. Releasing the mouse button in block 404 causes the first waveform (or a certain location on the first waveform) to be associated with the desired multi-source measurement. If a stack of icons is being dragged, then a next icon in the stack of icons may become a top-displayed icon.

The mouse button is pressed again while the cursor is over an icon (or stack of icons) displayed at or near the first waveform, as suggested by block 405. The mouse is then moved in order to drag the newly selected icon (or stack of icons) from the first waveform to a second waveform, as suggested by block 406.

The mouse button is released when the icon (or stack of icons) currently being dragged reaches a desired measurement location within the second waveform, as suggested by block 407. Releasing the mouse button in block 407 causes the second waveform to be associated with the desired multi-source measurement. Then, in response to the mouse button being released, a multi-source measurement related to the first and second waveforms is performed by the MTI 102 and displayed via the display 103 (FIG. 1). If a desired measurement requires the identification of additional measurement sources, then additional steps that are similar to those depicted in blocks 405–407 may be performed until all measurement sources are identified prior to the calculation and display of the multi-source measurement.

Figure 5A:
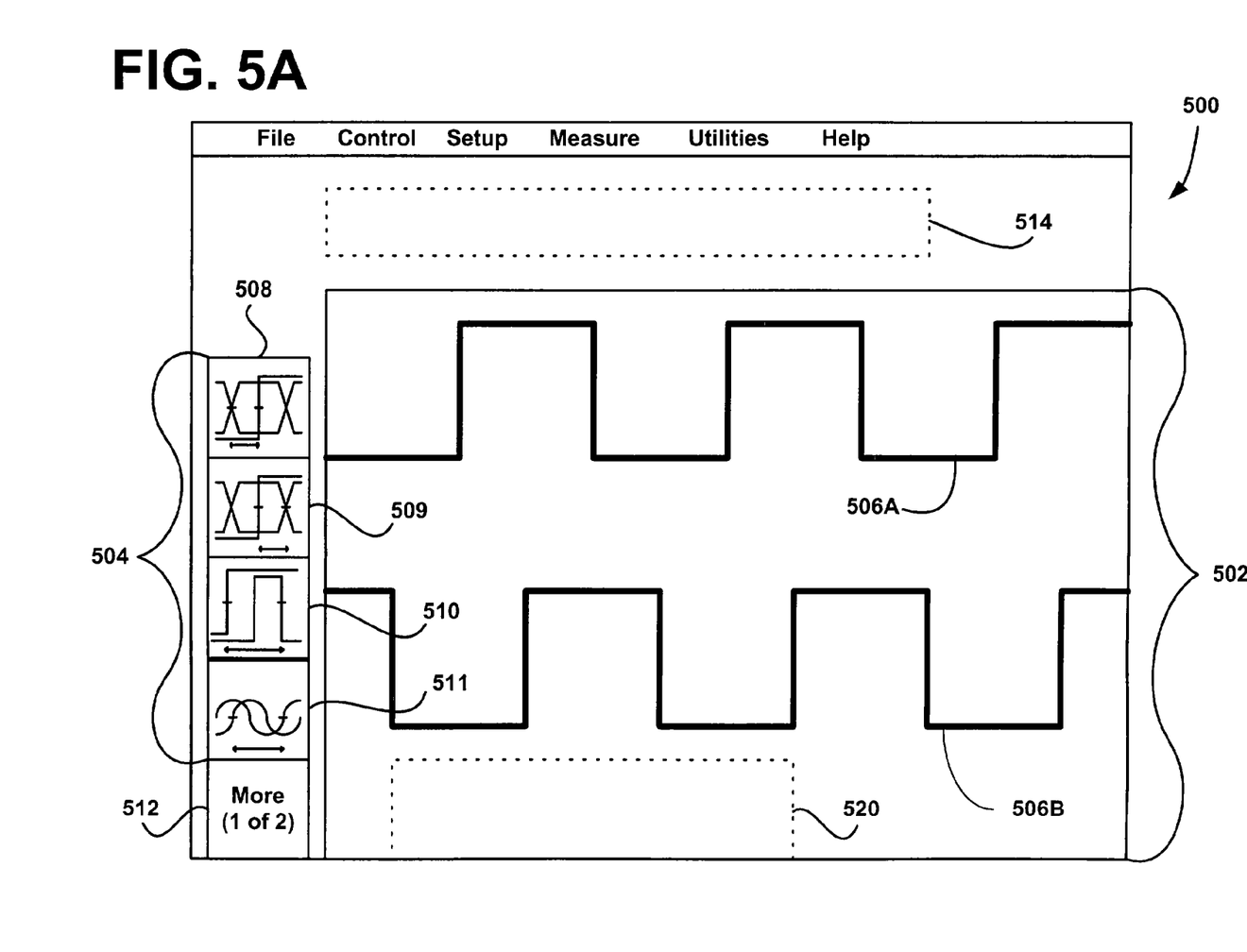
FIG. 5A–5D depict an example of graphical user interface (GUI) that may be provided by the MTI shown in FIG. 1.

FIG. 5A depicts a graphical user interface (GUI) 500 that assists a user in requesting a multi-source measurement. As shown in FIG. 5A, the GUI 500 includes a waveform display region 502 surrounded by a number of information and/or control menus. One such control menu is a measurement toolbar region 504. The measurement toolbar region 504 is preferably proximate to the waveform display region 502. In the illustrative embodiment, the toolbar region 504 is shown to be to the left of the waveform display region 502, and includes a number of icons corresponding to respective multi-source measurements.

Each icon in the toolbar region 504 preferably includes an image that communicates a corresponding type of measurement that the icon is used to implement. When a cursor is positioned over a measurement icon for a certain length of time, the MTI 102 generates a message in an information region 514 (FIG. 5A) identifying the type of measurement function that is associated with such icon.

In a preferred embodiment, the MTI 102 displays one of several panes of measurement icons. A "More" button 512 may be used to step through each pane until a desired series of measurement icons is displayed. In such an embodiment, the data structure also includes information identifying which pane of measurement icons is currently visible on the GUI 500. In an alternative embodiment, the display of measurement icons is managed with a scrollbar mechanism rather than panes.

The MTI 102 enables the user to drag a selected measurement icon across the waveform display region 502 and determines the nearest display element to the dragged icon. As the cursor is being dragged across the waveform display region 502, the MTI 102 performs an initial filtering of the display elements that are under or near the cursor. This enables the waveform identifier 204 to determine if such display elements are measurable waveforms (i.e., source waveforms).

Source waveforms may include, for example, channel waveforms, clock waveforms, formula waveforms and/or memory waveforms. The example illustrated in FIGS. 5A–5D includes two source waveforms that are displayed in the waveform display region 502: waveform 506A and waveform 506B.

In some embodiments, a textual indication is also provided, preferably in the information region 514. The textual information provides the user with an indication of when the mouse button may be released to apply the measurement function to the nearest waveform or whether the measurement icon is to be dragged further to be sufficiently close to a source waveform. Non-limiting examples of such information include, among others, "Release mouse here if multi-source measurement is to include channel 2," "Drag Measurement Icon to an Active Source," or "Drag Measurement Icon to Another Source," etc.

The MTI 102 preferably continually renders an icon at the location of the cursor as the icon is dragged across the waveform display region 502. Furthermore, the cursor is preferably pointing to an edge of an icon as it is being dragged across the waveform display region 502.

The multi-source measurement results are displayed in a result-display region 520 (FIG. 5A) of a GHI 500. Preferably, drop points and displayed measurement results are symbolically annotated to enable the user to easily associate the selected measurement, the results of that measurement and the location on the source waveform where the measurement is being applied.

Figure 5B:
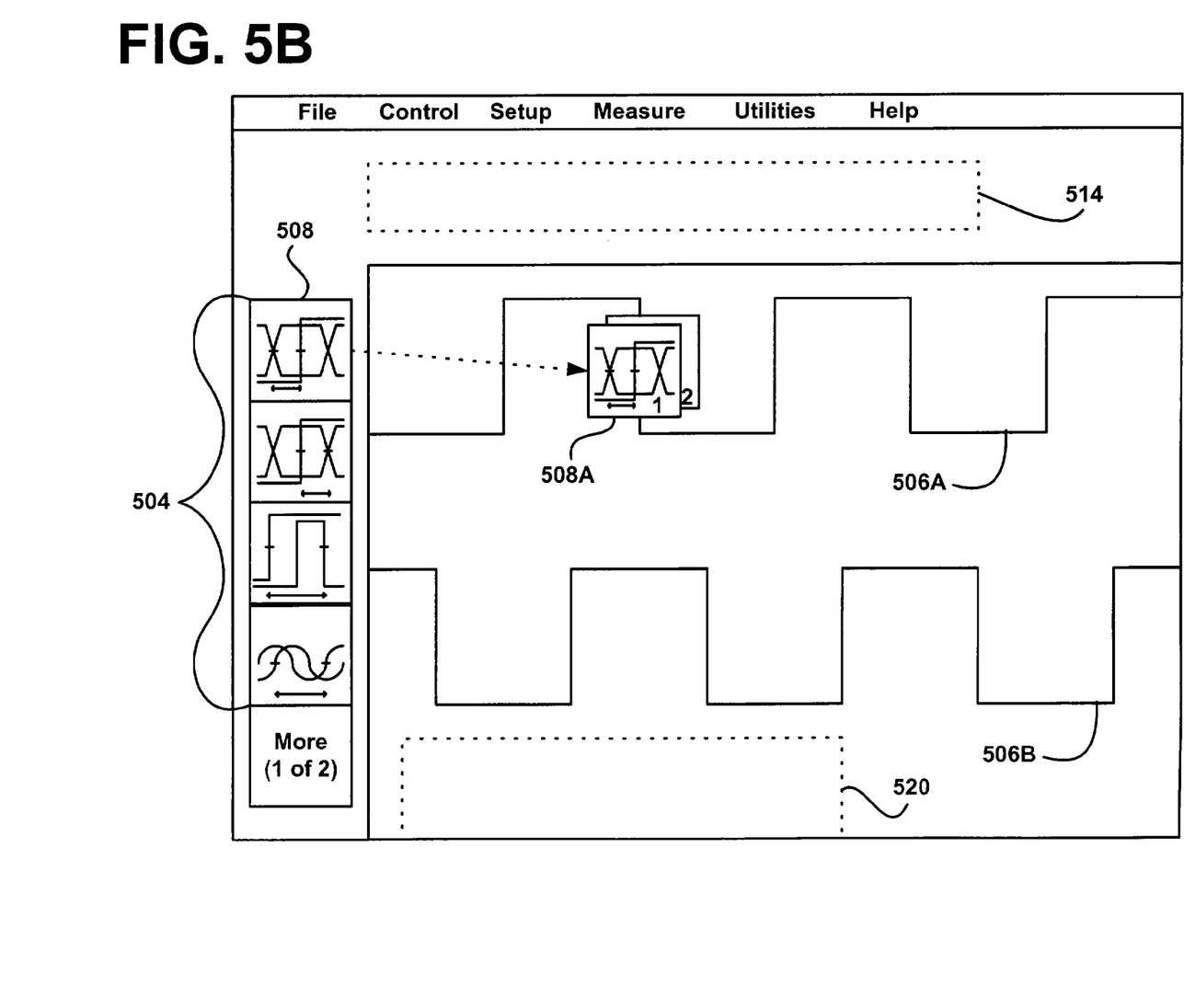
Figure 5C:
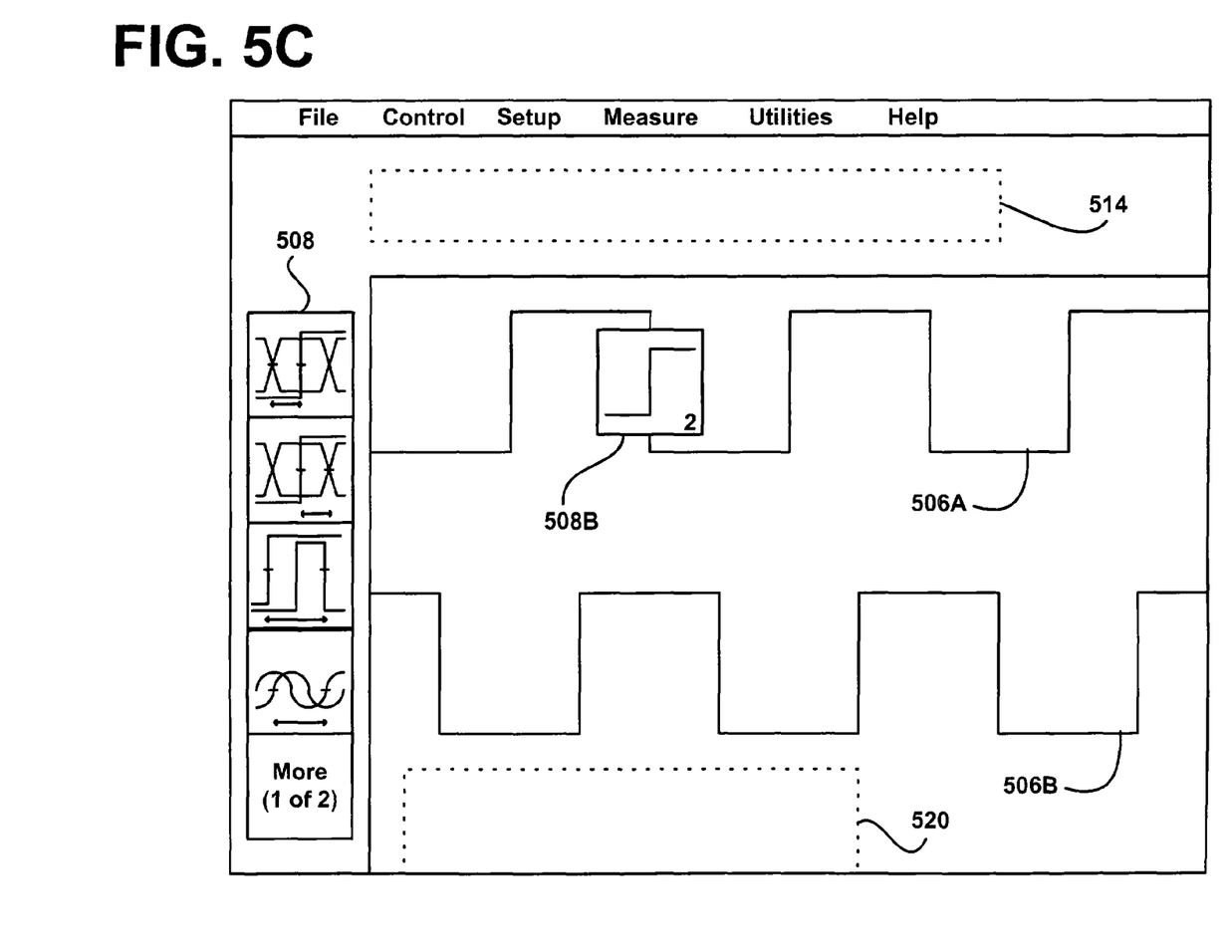
Figure 5D:
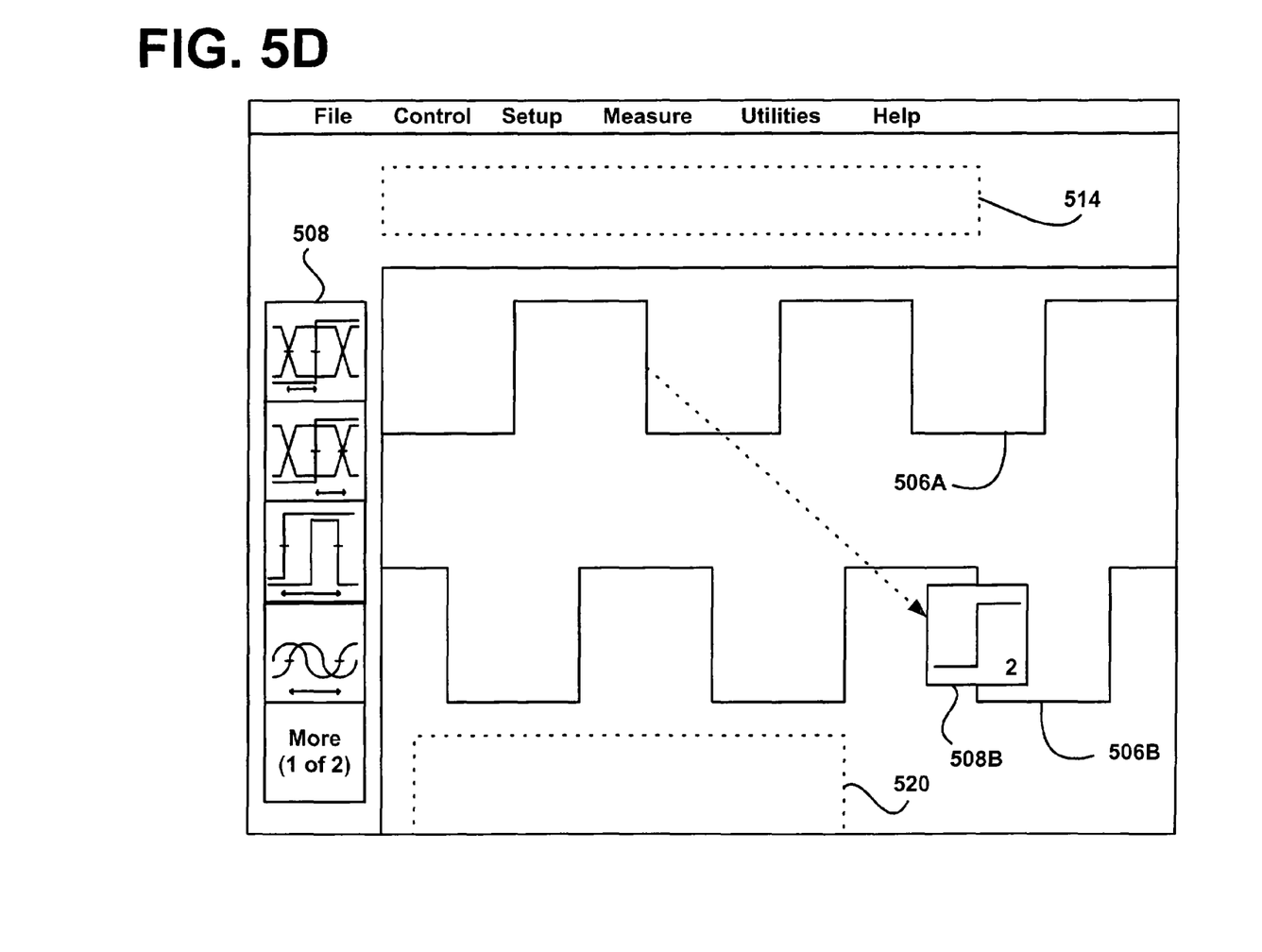

FIGS. 5B–5D depict an example of a graphical user interface that is provided as a user is identifying two sources for a multi-source measurement. Note that the embodiment illustrated in FIGS. 5B–5D may be easily adapted for identifying more than two measurement sources. With reference to FIG. 5B, a user selects a multi-source measurement represented by icon 508 (e.g. by pressing a mouse button). The user then drags a stack of icons 508A (corresponding to the selected multi-source measurement) from the location of icon 508, to a location on waveform 506A.

The stack of icons 508A may include, for example, a copy or modified copy of icon 508 as a top-displayed icon.

After the user designates a certain location on waveform 506A as a desired measurement location (e.g., by releasing the mouse button), then another icon 508B corresponding to the selected multi-source measurement is displayed in place of the stack of icons 508A, as shown in FIG. 5C. This other icon 508B is used to communicate to the user that another measurement source remains to be selected. If a plurality of measurement sources are yet to be identified, then a stack of icons may be displayed instead of icon 508B.

The user can drag icon 508B from a location on waveform 506A to a location on waveform 506B (e.g., by using a pointing device), as shown in FIG. 5D. After the user designates a certain location on waveform 506B as a desired measurement location (e.g., by releasing the mouse button), then the MTI 102 performs a multi-source measurement related to waveforms 506A and 506B and displays the multi-source measurement via the display 103 (FIG. 1). Note that if additional measurement sources are required for performing the multi-source measurement, then one or more additional icons (or stacks of icons) may be dragged to such measurement sources before the measurement is performed.

To further aid the user, one or more of the following may be performed by the MTI 102:
1. Dropped icons may be displayed until all measurement sources have been identified. This provides a visual cue that aids the user in remembering where each icon was dropped.
2. A text readout may be provided that indicates where each icon was dropped. This readout may be color-coded using the same color assigned to the corresponding measurement source.

FIGS. 6A and 6B depict an example of a graphical user interface that is provided as a user is identifying two sources for a multi-source measurement. Note that the embodiment illustrated in FIGS. 6A and 6B may be easily adapted for identifying more than two measurement sources.

With reference to FIG. 6A, a user selects a multi-source measurement represented by icon 508 (e.g. by pressing a mouse button while a cursor is located over the icon 508). The user then drags icon 508C (corresponding to the selected multi-source measurement) from the location of icon 508 to a location on waveform 506A where icon 508C is dropped.

The icon 508C may be, for example, a copy or modified copy of icon 508. After icon 508C is dropped on waveform 506A, a numeral displayed within the icon may be updated accordingly. For example, the numeral 1 may be changed to the numeral 2 to indicate that a second measurement source is to be identified next.

The user then drags icon 508C from the location where it was dropped on waveform 506A to a location on waveform 506B, as shown in FIG. 6B. After the user designates a certain location on waveform 506B as a desired measurement location (e.g., by releasing the mouse button), then the MTI 102 performs a multi-source measurement related to waveforms 506A and 506B and displays the multi-source measurement via the display 103 (FIG. 1). Note that if additional measurement sources are required for performing the multi-source measurement, then the icon 508C may also be dragged to and dropped at such measurement sources before the measurement is performed.

In some embodiments, an icon may be highlighted if it is over or near a waveform that is currently selectable by the icon. This informs the user whether a current waveform is a valid selection. An icon may be highlighted, for example, by having a border that has the same color as the selectable waveform. Furthermore, one of the waveforms depicted in the icon may be highlighted using the same color as that used to render a corresponding waveform under the icon.

There may be times when additional information is to be specified for a measurement source. In some embodiments, such information may be implemented using a drag-and-drop interface. For example, a pop-up menu may be displayed at a mouse cursor location after an icon is associated with (e.g., dropped at) a waveform. This pop-up menu may contain selections corresponding to the measurement represented by the icon.

An example of a measurement for which a pop-up menu may be used is a measurement that can operate on a rising edge, a falling edge, or both. For such a measurement, a pop-up menu may include three options:
1. Rising Edge
2. Falling Edge
3. Rising and/or Falling Edge Once the user has made a selection from the pop-up menu (e.g., using a mouse or other input device), the user may continue associating one or more icons with one or more other measurement sources, if applicable.

Figure 7A:
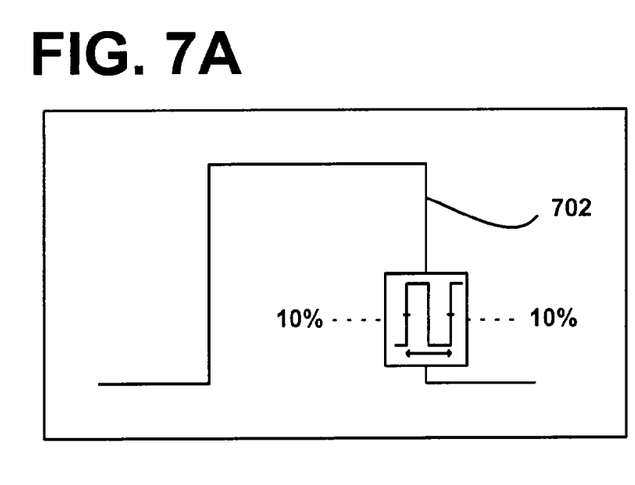
FIGS. 7A–7C are examples illustrating the setting of measurement thresholds for the MTI shown in FIG. 1.
Figure 7B:
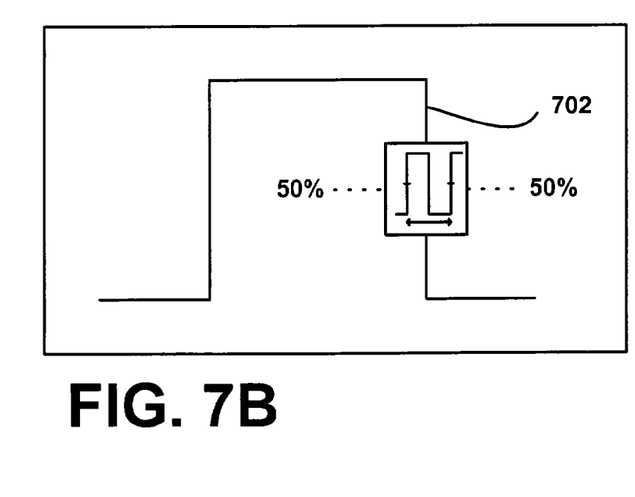
Figure 7C:
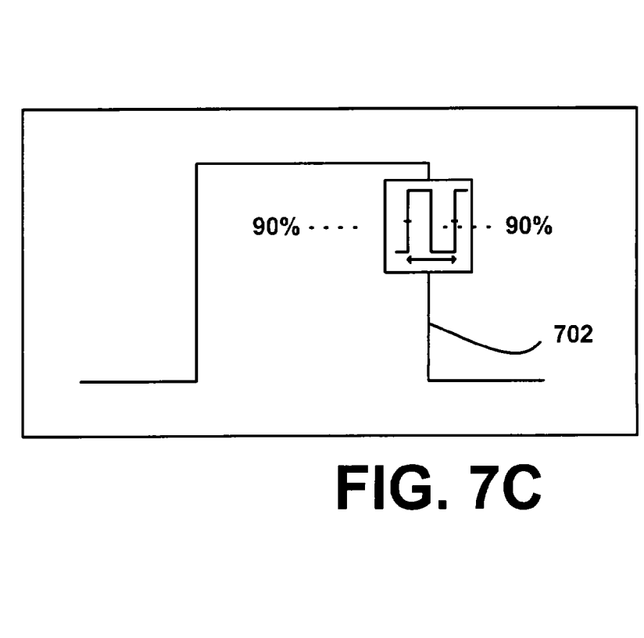

FIGS. 7A–7C are examples illustrating the setting of measurement thresholds. A measurement threshold corresponds to a point on a waveform at which an event is considered to occur. An example of a measurement threshold is a point at which an edge is considered to be a falling edge. There are different standards for defining what constitutes a rising or falling edge. This definition can be expressed in terms of an absolute value (e.g., a predetermined change in waveform size), or in terms of a percentage (e.g., a percentage change in waveform size). In some embodiments, a user may set a measurement threshold on a per-source basis by dropping an icon at a certain location on a waveform edge. The measurement instrument may display a current threshold level that is responsive to the location of the icon on a waveform-edge.

In the examples illustrated in FIGS. 7A–7C, a user designates a desired change in waveform size as a threshold by dropping an icon near the corresponding location of a waveform-edge 702. FIG. 7A shows that a user may set a 10% change in waveform size as a threshold level by dropping an icon near the bottom of the waveform-edge 702, FIG. 7B shows that the user may set a 50% change in waveform size as a threshold level by dropping the icon near the middle of the waveform-edge 702, and FIG. 7C shows that the user may set a 90% change in waveform size as a threshold level by dropping an icon near the top of the waveform-edge 702.

A user may pre-select available threshold levels. For example, a user may access a preference dialog titled "Drag-and-Drop Thresholds" that provides the following options:
1. Automatic
2. 10/50/90
3. 20/50/80

If the user selects the "Automatic" option then the threshold level would be determined by the MTI 102 and the instrument would not display a threshold level indication that is responsive to the location of the icon on a waveform-edge. Furthermore, behavior corresponding to the "Automatic" option would be performed by the MTI 102 if an alternative setting is not selected by a user (e.g., if the above-mentioned preference dialog is not accessed).

Figure 8A:
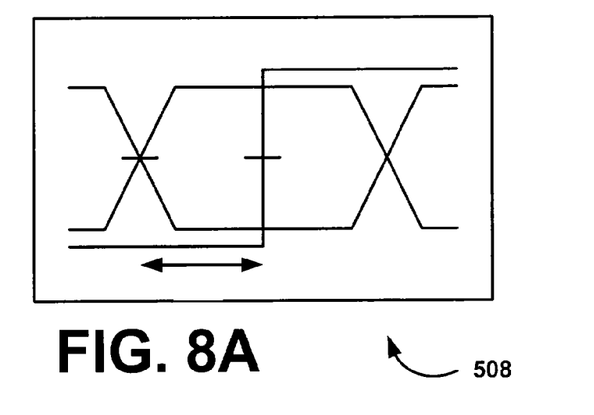
FIGS. 8A–8D depict examples of multi-source measurement icons that may be displayed in a measurement toolbar region shown in FIGS. 5 and 6.
Figure 8B:
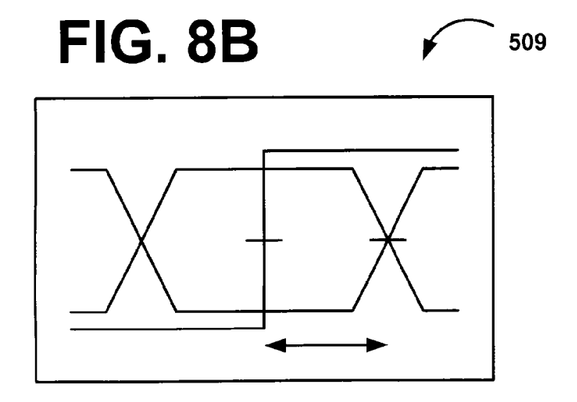
Figure 8C:
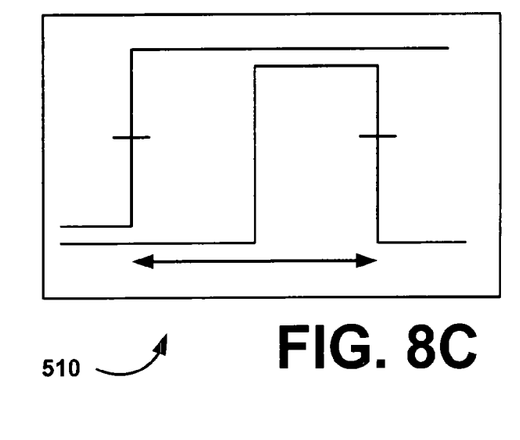
Figure 8D:
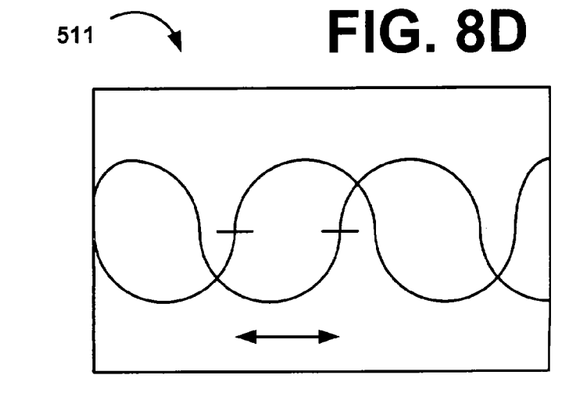

FIGS. 8A–8D depict non-limiting examples of multi-source measurement icons that may be displayed in a measurement toolbar region 504 (FIG. 5). FIG. 8A depicts an example of an icon 508 that can be used to initiate a set-up time measurement; FIG. 8B depicts an example of an icon 509 that can be used to initiate a hold-time measurement; FIG. 8C depicts an example of an icon 510 that can be used to initiate a time-difference measurement; and FIG. 8D depicts an example of an icon 511 that can be used to initiate a phase-difference measurement. Of course, other images may alternatively be used to represent each of the aforementioned types of multi-source measurements. Furthermore, other images may be used to represent other types of respective multi-source measurements.

Figure 9A:
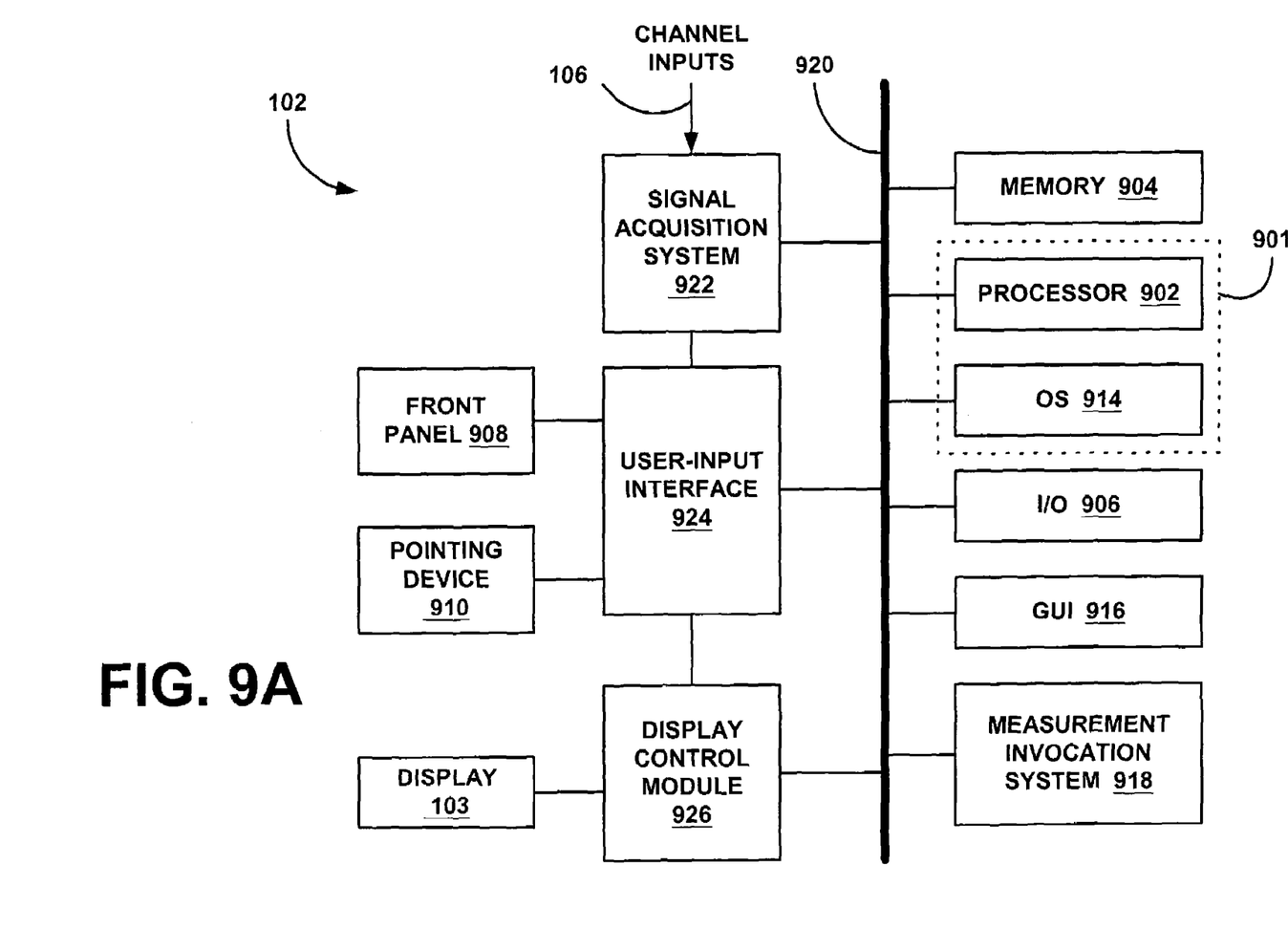
FIG. 9A is a functional block diagram depicting an embodiment of the MTI shown in FIG. 1.

FIG. 9A is a functional block diagram of an exemplary MTI 102. The MTI 102 may be, for example, a digital oscilloscope designed to acquire, analyze and display a wide variety of signals. The MTI 102 preferably includes a general purpose computer system, which is programmable using a high level computer programming language, and specially programmed, special purpose hardware for performing signal acquisition, analyze and display functions.

As shown in FIG. 9A, the MTI 102 includes a processor 902, a memory unit 904, input/output (I/O) interface cards 906, data storage devices (such as, for example, a hard disk (not shown)), one or more input devices such as a front-panel keyboard 908 and a pointing device 910, and a display 103. The memory 904 is used for storage of program instructions and of results of calculations performed by the processor 902. In some embodiments, the memory 904 includes random access memory (RAM). The display is preferably a liquid crystal display and is logically or physically divided into an array of picture elements (pixels). The input/output (I/O) interface cards 906 may include, for example, a modem card, a network interface card, and/or a sound card, etc.

The processor 902 executes an operating system 914 which controls the execution of other computer programs such as a graphical user interface (GUI) application 916 and the measurement invocation system 918, and provides scheduling, input-output control, file and data management, memory management, and communication control and related services. The processor 902 and operating system 914 comprise a computer platform 901, for which application programs in high level programming languages are written. The functional elements of the MTI 102 communicate with each other via a data bus 920.

The signal acquisition system 922 receives input signals through channel inputs 106, and uses the input signals to produce digital data that is to be rendered via the display 103. The signal acquisition system 922 may perform, for example, analog to digital conversion, and may map the resulting digital data to the physical pixel locations which are ultimately presented on the display 103 under the control of the GUI application 916.

The pointing device 910 and/or the keyboard 908 are used to move a cursor on the display 103 to select display elements under the cursor. The pointing device 910 may be, for example, a mouse, a trackball or a joy-stick. Of course, the cursor may be alternatively or additionally be controlled with one or more other input devices coupled to the MTI 102.

The user-input interface 924 receives control commands and cursor input information from the front panel keyboard 908 and the pointing device 910. The user-input interface 924 provides the display control module 926 with display information regarding each pixel location. The display control module 926 is configured cause the display 103 to display images that correspond to the display information received from the user-input interface 924 and that are in accordance with instructions contained in the GUI application 916. The measurement invocation system 918 implements a method for performing multi-source measurements of waveforms displayed via the display 103.

Figure 9B:
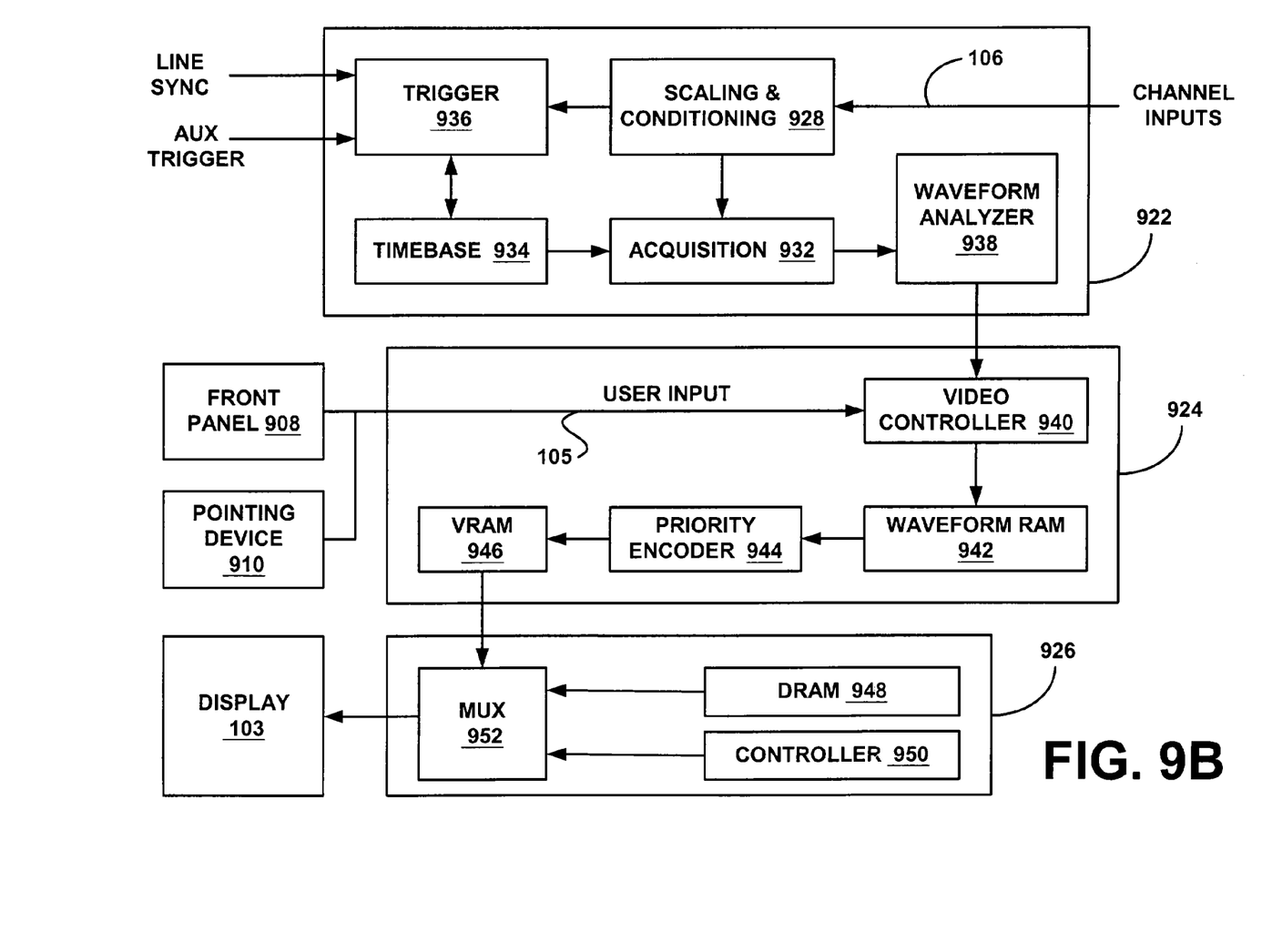
FIG. 9B is a simplified block diagram depicting operation of the MTI shown in FIG. 9A.

FIG. 9B is a simplified block diagram depicting an example of data flow within the MTI 102. The MTI 102 includes a signal acquisition system 922, a user-input interface 924 and a display control module 926. The signal acquisition system 922 includes a scaling and conditioning module 928 that receives channel inputs 106. The scaling and conditioning module 928 and an acquisition module 932 include high frequency electronics for signal acquisition, signal conditioning, and analog-to-digital conversion.

A timebase module 934 drives the analog-to-digital conversion process performed in the signal acquisition module 932, specifying when to sample the input signals and how many samples are to be taken. A trigger module 936 synchronizes the acquisition process through the timebase module 934, enabling a user to arrange a trigger event to obtain a stable waveform display of the desired features of one or more of the input signals. The trigger module 936 may be based, for example, upon a line sync or auxiliary trigger input.

A waveform analyzer 938 develops a waveform for display by, for example, setting analog-to-digital codes for the acquisition module 932, and mapping the resulting digital information to the physical pixel locations which are ultimately presented on the display 103. The pointing device 910 and/or the keyboard 908 are used to move a cursor on the display 103 to select display elements under a cursor.

The user-input interface 924 includes a video controller 940 that controls the rendering of pixels into the waveform random access memory (RAM) 942. The user-input interface 924 receives display element control commands and cursor input information from the front panel keyboard 908 and the pointing device 910. The waveform RAM 942 includes a data structure for each pixel location on the display 103. These data structures contain information regarding every display element that is to be drawn at each pixel location. The waveform RAM 942 supplies the priority encoder 944 with this information. The priority encoder 944 then sends the selected color to the VRAM 946, which then causes the pixel to be rendered in the indicated color.

Although there may be multiple display elements which are to be drawn at a given pixel location, only one color may be rendered at that location. The priority encoder 944 prioritizes the competing display elements. For example, if the user positions a cursor over a waveform, then the priority encoder 944 selects the display element with a highest predetermined priority. In such an example, the color of the cursor may be rendered at the relevant pixel locations, thereby providing an image that shows the cursor over the waveform.

The display control module 926 includes a dynamic random access memory (DRAM) 948. The DRAM 948 and the video random access memory (VRAM) 946 each contains data specifying a color for each pixel in the display 103. The computer system 901 (FIG. 9A) controls the data in DRAM 948. For each pixel in the display 103, the video controller 926 selects whether such pixel is specified using data from VRAM 946 or DRAM 948. The video controller 926 includes a controller 950 and a multiplexer 952. The controller 950 controls which of the two inputs to the multiplexer 952 are processed into display signals for transmission to the display 103.

It should be emphasized that the above-described embodiments are merely possible examples, among others, of the implementations. Many variations and modifications may be made to the above-described embodiments. All such modifications and variations are intended to be included herein within the scope of the disclosure and protected by the following claims.

What is claimed is:

1. A method comprising:
displaying a first waveform and a second waveform;
displaying a plurality of icons, each icon corresponding to a measurement to be performed of a parameter defining a relationship between the first waveform and the second waveform;
enabling a user to select one of the plurality of icons;
enabling the user to mark a first point on the first waveform;
enabling the user to mark a second point on the second waveform;
performing a measurement based on the selected icon, the first point on the first waveform, and the second point on the second waveform.

2. The method of claim 1, wherein the parameter is one of a set-up time, a hold-time, a time difference, and a phase difference.

3. The method of claim 2, further comprising:
displaying the measured parameter.

4. The method of claim 1, wherein enabling the user to mark the first and second points further comprises:
responding to a user-manipulated pointing device, the pointing device comprising one of a mouse, a joy-stick, a track-ball, a keyboard, a touch-screen, and a touch-pad.

5. The method of claim 1, wherein enabling the user to mark the first and second points further comprises:
placing markers on the first and second points, the markers being similar in appearance to the selected icon.

6. The method of claim 1, wherein displaying the first and second waveforms further comprises:
receiving first and second signals from a device under test, the first and second signals corresponding to the first and second waveforms, respectively.

7. The method of claim 1, further comprising:
enabling the user to set a measurement threshold based on a percentage of change of one of the first and second waveforms.

8. A measuring and testing instrument (MTI) comprising:
a display device configured to display a first waveform, a second waveform, and a plurality of icons, each icon corresponding to a measurement to be performed of a parameter defining a relationship between the first waveform and the second waveform;
means for receiving user input, the user input corresponding to a selected first point on the first waveform, and a selected second point on the second waveform, and a selected icon; and
means for measuring a parameter based on the selected icon, the first point, and the second point.

9. The MTI of claim 8, wherein the measured parameter is one of a set-up time, a hold-time, a delay, and a phase difference.

10. The MTI of claim 9, wherein the display device is further configured to display the measured parameter.

11. The MTI of claim 8, further comprising a pointing device allowing a user to select the first point on the first waveform, the second point on the second waveform, and one of the displayed icons.

12. The MTI of claim 11, wherein the pointing device is one of a mouse, a joy-stick, a track-ball, a keyboard, a touch-screen, and a touch-pad.

13. The MTI of claim 8, wherein the display device is further configured to display a first mark representing the selected first point on the first waveform and a second mark representing the selected second point on the second waveform.

14. The MTI of claim 13, wherein the first and second marks are similar in appearance to the selected icon.

15. The MTI of claim 8, further comprising an oscilloscope configured to receive the first and second waveforms from a device under test.

16. A graphical user interface (GUI) for use with a measurement device, the GUI comprising:
a waveform display region for displaying a first waveform and a second waveform; and
a toolbar region for displaying a plurality of icons, each icon corresponding to a measurement to be performed of a parameter defining a relationship between the first waveform and the second waveform;
wherein, by manipulation of a pointing device, a first marker is displayed on a first point of the first waveform and a second marker is displayed on a second point of the second waveform.

17. The GUI of claim 16, further comprising an information region for displaying a type of measurement being performed based on a selected icon.

18. The GUI of claim 16, further comprising a result region for displaying results of a measurement.

19. The GUI of claim 16, wherein the first and second markers are positioned over the first and second waveform, respectively, by a drag-and-drop process.

* * * * *